United States Patent
Sundstrom et al.

(10) Patent No.: US 9,520,834 B2
(45) Date of Patent: Dec. 13, 2016

(54) QUADRATURE MIXER ARRANGEMENT

(71) Applicant: Telefonaktiebolaget L M Ericsson (publ), Stockholm (SE)

(72) Inventors: Lars Sundstrom, Sodra Sandby (SE); Staffan Ek, Lund (SE); Jim Svensson, Solna (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/896,390

(22) PCT Filed: Jun. 10, 2013

(86) PCT No.: PCT/EP2013/061904
§ 371 (c)(1),
(2) Date: Dec. 6, 2015

(87) PCT Pub. No.: WO2014/198287
PCT Pub. Date: Dec. 18, 2014

(65) Prior Publication Data
US 2016/0126893 A1 May 5, 2016

(51) Int. Cl.
*H03D 7/14* (2006.01)
*H03D 7/18* (2006.01)
(Continued)

(52) U.S. Cl.
CPC .......... *H03D 7/14* (2013.01); *H03D 3/009* (2013.01); *H03D 7/166* (2013.01); *H03D 7/18* (2013.01);
(Continued)

(58) Field of Classification Search
CPC ........ H03D 3/009; H03D 7/14; H03D 7/1425; H03D 7/166; H03D 7/18; H04L 27/364; H04L 27/365; H04L 27/3863
(Continued)

(56) References Cited

U.S. PATENT DOCUMENTS 5,937,341 A * 8/1999 Suominen .............. H03D 3/007
375/324
6,330,290 B1 * 12/2001 Glas ....................... H03D 3/009
329/306
(Continued)

FOREIGN PATENT DOCUMENTS

EP    2328269 A2    6/2011
EP    2434640 A1    3/2012
(Continued)

OTHER PUBLICATIONS

L. Sundstrom et al., Harmonic Rejection Mixer at ADC Input for Complex IF Dual Carrier Receiver Architecture, 2012 IEEE Radio Frequency Integrated Circuits Symposium, pp. 265-268.
(Continued)

*Primary Examiner* — William Hernandez
(74) *Attorney, Agent, or Firm* — Leffler Intellectual Property Law, PLLC

(57) ABSTRACT

A quadrature mixer arrangement is disclosed, which is adapted to translate an input signal by a translation frequency. The mixer arrangement is operated at a clock rate that equals the translation frequency times an oversampling rate, wherein the oversampling rate is not a multiple of four. The mixer arrangement comprises a sequence generator, at least one pair of mixers, and one or more correction networks. The sequence generator generates an in-phase mixer translation sequence and a quadrature-phase mixer translation sequence based on the oversampling rate. The in-phase mixer translation sequence is a time-discrete representation of a translation frequency sinusoidal function sampled at the clock rate, and the quadrature-phase mixer translation sequence is a time-discrete representation of the translation frequency sinusoidal function phase-shifted by $\pi/2$ plus a phase deviation and sampled at the clock rate, wherein the phase deviation is a function of the oversampling rate. Each
(Continued)

pair of mixers comprises an in-phase mixer and a quadrature-phase mixer, each adapted to translate a respective input signal based on the respective translation frequency. The one or more correction networks are adapted to, based on the oversampling rate and the phase deviation, compensate for the phase deviation by adjusting at least one of the in-phase mixer input signal, the quadrature-phase mixer input signal, the in-phase mixer output signal, and the quadrature-phase mixer output signal.

18 Claims, 7 Drawing Sheets

(51) Int. Cl.
    *H04L 27/36*     (2006.01)
    *H04L 27/38*     (2006.01)
    *H03D 3/00*     (2006.01)
    *H03D 7/16*     (2006.01)

(52) U.S. Cl.
    CPC .......... *H04L 27/364* (2013.01); *H04L 27/365* (2013.01); *H04L 27/3863* (2013.01)

(58) Field of Classification Search
    USPC ................. 327/113, 119, 120, 355, 356, 357
    See application file for complete search history.

(56) References Cited

U.S. PATENT DOCUMENTS

| | | | | |
|---|---|---|---|---|
| 7,599,676 | B2 | 10/2009 | Maxim | |
| 2005/0070239 | A1* | 3/2005 | Paulus | H03D 3/009 455/205 |
| 2007/0072574 | A1* | 3/2007 | Ragan | H04B 1/28 455/313 |
| 2008/0181340 | A1 | 7/2008 | Maxim | |
| 2011/0007847 | A1* | 1/2011 | O'Keeffe | H04L 25/062 375/319 |
| 2012/0322398 | A1* | 12/2012 | Pullela | H03D 7/1466 455/302 |

FOREIGN PATENT DOCUMENTS

| | | |
|---|---|---|
| WO | 2007096800 A2 | 8/2007 |
| WO | 20090057051 A2 | 5/2009 |
| WO | 2010000603 A1 | 1/2010 |
| WO | 2011070013 A2 | 6/2011 |
| WO | 2012038338 A1 | 3/2012 |

OTHER PUBLICATIONS

Jeffrey A. Weldon et al., A 1.75-GHz Highly Integrated Narrow-Band CMOS Transmitter with Harmonic-Rejection Mixers, IEEE Journal of Solid-State Circuits, vol. 36, No. 12, Dec. 2001, pp. 2003-2015.
Lars Sundstrom et al., Complex IF Harmonic Rejection Mixer for Non-Contiguous Dual Carrier Reception in 65 nm CMOS, (2012) European Solid State Circuits Conference, ESSCIRC in 2012 Proceedings of the ESSCIRC(ESSCIRC), pp. 357-360.
Z. Ru et al., A Software-Defined Radio Receiver Architecture Robust to Out-of-Band Interference, 2009 IEEE intrnational Solid-State Circuits Conference, ISSCC 2009, Session 12, RF Building Block, 12.8, Feb. 10, 2009, pp. 230-232.
PCT International Search Report, mailed Feb. 6, 2014, in connection with International Application No. PCT/EP2013/061904, all pages.
PCT Written Opinion, mailed Feb. 6, 2014, in connection with International Application No. PCT/EP2013/061904, all pages.
Travis Forbes et al., Embedded LO Synthesis Method in Harmonic Rejection Mixers, Circuits and Systems (MWSCAS), 2012 IEEE 55th International Midwest Symposium, pp. 750-753.
Ru et al., Discrete-Time Mixing Receiver Architecture for RF-Sampling Software-Defined Radio, IEEE Journal of Solid-State Circuites, vol. 45, No. 9, Sep. 2010, pp. 1732-1745.

* cited by examiner

QUADRATURE MIXER ARRANGEMENT

TECHNICAL FIELD

The present invention relates generally to the field of quadrature mixers. More particularly, it relates to quadrature mixers operated based on a time-discrete representation of translation frequency signals.

BACKGROUND

In a quadrature mixer arrangement, one or more input signals is typically mixed with two versions of a translation frequency signal to translate the input signals by the translation frequency (often denoted local oscillator—LO—frequency) to produce one or more output signals. The two versions of the translation frequency signal are typically an in-phase version and a quadrature-phase version having a mutual phase difference of π/2 or close thereto.

Quadrature mixers may, for example, be used in the form of harmonic rejection mixers. Good harmonic rejection may be important to achieve performance requirements, for example, in carrier aggregation receivers, television receivers, and software defined radio receivers.

Time and amplitude discrete implementations of harmonic rejection mixers have been described in, for example, WO2010/000603, L. Sundström, et al., "Harmonic rejection mixer at ADC input for complex IF dual carrier receiver architecture," IEEE Radio Frequency Integrated Circuits Symposium, June 2012, and L. Sundström, et al., "Complex IF harmonic rejection mixer for non-contiguous dual carrier reception in 65 nm CMOS," IEEE European Solid-State Circuits Conference, September 2012.

FIGS. 1A and 1B illustrate schematically an example complex intermediate frequency (IF) dual carrier receiver and a corresponding example implementation of a complex IF mixer, 100A, 100B.

In the example illustrated in FIG. 1A, a dual carrier signal 101 comprising two components 140, 141 is input to a low-noise amplifier (LNA) 102. The two components 140, 141 are located on opposite sides of a radio frequency ($f_{RF}$).

The output 103, 104 of the LNA is mixed with a radio frequency cosine signal 105 in an in-phase mixer 107 and with a radio frequency sinus signal 106 in a quadrature-phase mixer 108. It should be noted that, throughout the disclosure, a reference to a cosine, sinus or sinusoidal signal or function comprises a simplified figurative description and that all functional equivalents are to be construed as embraced therein. For example, the cosine and sinus signals 105, 106 of FIG. 1A may, in an actual implementation, comprise hard-switched signals (representing staircase-type functions which approximate the cosine and sinus signals respectively).

The down-converted signals are filtered in respective low-pass filters (LPF) 109, 110 to exclude any higher frequency signal components, and the filtered signals 111, 112 comprise the two dual carrier components 142, 143, which are located at an intermediate frequency ($f_{IF}$) on opposite sides of zero frequency. The filtered signal 111 is termed in-phase intermediate frequency signal $I_{IF}$, and the filtered signal 112 is termed quadrature-phase intermediate frequency signal $Q_{IF}$.

The in-phase intermediate frequency signal and the quadrature-phase intermediate frequency signal are input to a complex IF mixer 100A comprising first and second intermediate frequency mixers (IF MIX) 113, 114. The first intermediate frequency mixer 113 is adapted to provide in-phase and quadrature-phase baseband components 127, 128 of the first dual carrier component 140, 142, 144 and the second intermediate frequency mixer 114 is adapted to provide in-phase and quadrature-phase baseband components 129, 130 of the second dual carrier component 141, 143, 145. The signals 127, 128, 129, 130 provided by the complex IF mixer 100A may be filtered and converted to the digital domain in respective low-pass filters (LPF) 115, 116, 117, 118 and analog-to-digital converters (ADC) 119, 120, 121, 122 to produce digital in-phase and quadrature-phase baseband signals of the first and second dual carrier component 123, 124, 125, 126.

In a typical example, the first intermediate frequency mixer 113 may implement a multiplication by exp($j\omega_{IF}t$), wherein the complex input signal 111 and 112 is translated to the complex output signal 127 and 128. Similarly, the second intermediate frequency mixer 114 may implement a multiplication by exp($-j\omega_{IF}t$), wherein the complex input signal 111 and 112 is translated to the complex output signal 129 and 130.

FIG. 1B illustrates one example of a practical implementation of a complex IF mixer 100B which may, for example, be used as the complex IF mixer 100A of FIG. 1A. The example complex mixer 100B has a complex input signal 111b, 112b and two complex output signals 127b, 128b and 129b, 130b.

The first in-phase output signal 127b is produced by mixing the in-phase input signal 111b with an intermediate frequency cosine signal in an in-phase mixer 151 and subtracting the quadrature-phase input signal 112b mixed with an intermediate frequency sinus signal in a quadrature-phase mixer 152 there from. The first quadrature-phase output signal 128b is produced by mixing the quadrature-phase input signal 112b with an intermediate frequency cosine signal in a quadrature-phase mixer 154 and adding the in-phase input signal 111b mixed with an intermediate frequency sinus signal in a quadrature-phase mixer 153 thereto.

The second in-phase output signal 129b is produced by mixing the in-phase input signal 111b with an intermediate frequency cosine signal in the in-phase mixer 151 and adding the quadrature-phase input signal 112b mixed with an intermediate frequency sinus signal in the quadrature-phase mixer 152 thereto. The second quadrature-phase output signal 130b is produced by mixing the quadrature-phase input signal 112b with an intermediate frequency cosine signal in the quadrature-phase mixer 154 and subtracting the in-phase input signal 111b mixed with an intermediate frequency sinus signal in the quadrature-phase mixer 153 there from.

It should be noted that the multiplications by exp($j\omega_{IF}t$) and exp($-j\omega_{IF}t$) may be interchanged and the multiplications by cos($\omega_{IF}t$) and sin($\omega_{IF}t$) may be replaced by multiplications by cos($\omega_{IF}t$) and $-$sin($\omega_{IF}t$). Other variations are also possible as is well known in the art.

In some quadrature mixer arrangements, the translation frequency signal versions (e.g. the intermediate frequency sinus and cosine signals of FIG. 1B) may be time-discrete (and possibly amplitude-discrete, i.e. quantized) representations of the sinusoid signals with appropriate phase shift. Thus, the translation frequency signal versions correspond to a sampled (and possibly quantized) sinusoid signal. The number of samples per translation frequency signal period is termed the over-sampling rate (OSR) herein. For reasons of spectral purity and low complexity, mixers may operate with an integer number of samples per translation frequency signal period (or, equivalently, LO period). Thus, the oversampling rate is an integer in such implementations.

In the scenario with time-discrete translation frequency signals, there is no explicit LO waveform provided to each mixer in the time-discrete mixer implementation. Rather, the mixer arrangement is driven by a clock with a rate that equals the over-sampling rate times the translation frequency and each mixer can be said to have an equivalent LO waveform. Regardless of how the mixer arrangement is implemented, there will always be either an explicit LO waveform or an equivalent (implicit) LO waveform associated with each mixer. Any reference herein to LO waveform (or related parameters or signals) is meant to embrace both the explicit and implicit scenario.

As mentioned above, a quadrature mixer typically consists of mixer elements operated with a phase difference of $\pi/2$ (90 degrees). If these mixer elements are to be operated in an identical fashion (generating identical equivalent LO waveforms with a phase difference of $\pi/2$) in a time-discrete and quantized scenario, the over-sampling rate should be a multiple of 4 so that the time-discrete translation frequency signal sequences are shifted versions of each other (the shift corresponding to a time shift). In a typical implementation this means that the rate of the clock driving the mixer and/or the translation frequency signal generator should be 4 times N times the translation frequency, where N is an integer. Due to practical reasons (e.g., limited frequency range of the clock) the over-sampling rate is often limited to, for example, an integer between 6 and 20, leaving only the alternatives {8,12,16,20} given the restriction explained above. In some scenarios, the time-discrete translation frequency signal sequences may be chosen such that they are not (time) shifted versions of each other and still provide a high harmonic rejection.

Regardless of the time-discrete translation frequency signal sequences being different or not, a requirement to provide high harmonic rejection while the over-sampling rate is not a multiple of 4 will generally lead to that the magnitude and phase of the fundamental frequency component of one sequence will be different from that of the other sequence. This translates to a severely limited image rejection ratio.

Therefore, there is a need for quadrature mixer arrangements where an arbitrary over-sampling rate may be applied, preferably while maintaining a high image rejection ratio.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to obviate at least some of the above disadvantages and to provide a quadrature mixer arrangement where an arbitrary over sampling rate may be applied.

According to a first aspect, this is achieved by a quadrature mixer arrangement adapted to frequency translate a mixer arrangement input signal by a translation frequency to produce a mixer arrangement output signal. The quadrature mixer arrangement is adapted to be operated at a mixer arrangement clock rate that equals the translation frequency times an oversampling rate, wherein the oversampling rate plus an integer number of one, two or three is a multiple of four.

The quadrature mixer arrangement comprises a sequence generator, at least one pair of mixers and one or more correction networks.

The sequence generator is adapted to generate, based on the oversampling rate, an in-phase mixer translation sequence and a quadrature-phase mixer translation sequence. The in-phase mixer translation sequence is a time-discrete representation of a translation frequency sinusoidal function sampled at the mixer arrangement clock rate, and the quadrature-phase mixer translation sequence is a time-discrete representation of the translation frequency sinusoidal function phase-shifted by $\pi/2$ plus a phase deviation and sampled at the mixer arrangement clock rate, wherein the phase deviation is a function of the oversampling rate.

Each pair of the at least one pair of mixers comprises an in-phase mixer and a quadrature-phase mixer. The in-phase mixer is adapted to translate an in-phase mixer input signal, based on the in-phase mixer translation sequence, to produce an in-phase mixer output signal and the quadrature-phase mixer is adapted to translate a quadrature-phase mixer input signal, based on the quadrature-phase mixer translation sequence, to produce a quadrature-phase mixer output signal. The in-phase mixer input signal and the quadrature-phase mixer input signal are associated with the mixer arrangement input signal and the in-phase mixer output signal and the quadrature-phase mixer output signal are associated with the mixer arrangement output signal.

The one or more correction networks are adapted to compensate for the phase deviation, based on the oversampling rate and the phase deviation, by adjusting at least one of the in-phase mixer input signal, the quadrature-phase mixer input signal, the in-phase mixer output signal, and the quadrature-phase mixer output signal.

That the quadrature mixer arrangement is adapted to be operated at a mixer arrangement clock rate does not necessarily imply that there is a physical clock signal with the mixer arrangement clock rate on the chip. For example, both edges of a physical clock signal may be used. Alternatively or additionally, a physical clock signal with a higher frequency than the mixer arrangement clock rate may be used without updating the mixer arrangement in every period of the physical clock signal.

As derivable from the above, the oversampling rate is not equal to a multiple of four. Thus, the oversampling rate is indivisible by four. According to a typical embodiment, the oversampling rate is an integer not equal to a multiple of four.

Sinusoidal signals may be defined as an ensemble of signals having the form of a sinus function (or cosine function) with an arbitrary phase shift.

In some embodiments, a mixer arrangement clock generates a clock signal having the mixer arrangement clock rate. The mixer arrangement clock may or may not be comprised in the quadrature mixer arrangement.

In some embodiments, the in-phase mixer and the quadrature-phase mixer are adapted to translate the respective mixer input signal by the translation frequency.

The time-discrete representation of the translation frequency sinusoidal functions (for in-phase and quadrature-phase) sampled at the mixer arrangement clock rate may comprise an approximation of the corresponding translation frequency sinusoidal function sampled at the mixer arrangement clock rate. The approximation may, for example, be due to quantization, matching errors, component imperfections, etc.

According to some embodiments, the in-phase time-discrete representation comprises the translation frequency sinusoidal function sampled at the mixer arrangement clock rate, and the quadrature-phase time-discrete representation comprises the translation frequency sinusoidal function phase-shifted by $\pi/2$ plus the phase deviation and sampled at the mixer arrangement clock rate. In some embodiments, the in-phase mixer translation sequence is a quantized version of the translation frequency sinusoidal function sampled at the mixer arrangement clock rate, and the quadrature-phase mixer translation sequence is a quantized version of the translation frequency sinusoidal function phase-shifted by $\pi/2$ plus the phase deviation and sampled at the mixer arrangement clock rate.

The sequence generator may, according to some embodiments, comprise a shifter adapted to generate the quadrature-phase mixer translation sequence as the in-phase mixer translation sequence shifted a number of positions or vice versa. The number of positions may correspond to $\pi/2$ plus the phase deviation. Alternatively or additionally, the sequence generator may be adapted to generate each of the quadrature-phase mixer translation sequence and the in-phase mixer translation sequence to optimize harmonic rejection properties of the mixer arrangement. In one embodiment of the latter case (for each of the in-phase and quadrature-phase sequences respectively) the translation sequences may be generated (based on a given over-sampling rate and a limited number of discrete amplitude levels) by finding a sequence pair that gives desired harmonic rejection performance without considering the implications, i.e. the amount of phase deviation and gain imbalance introduced between the sequences.

It should be noted that generation of the translation sequences may comprise selecting pre-calculated translation sequences based on the oversampling rate.

In some embodiments, the sequence generator may be adapted to generate at least one of the in-phase and quadrature-phase mixer translation sequences by addressing a memory based on the oversampling rate. For example, the oversampling rate may be input to an address generator. In some embodiments, the memory has stored a single translation sequence pair for each oversampling rate, and in other embodiments, there may be several stored translation sequence pairs for each oversampling rate.

The phase deviation may be less than or equal to an equivalent phase of an inverse of the mixer arrangement clock rate divided by 2. The equivalent phase of the inverse of the mixer arrangement clock rate divided by 2 may equal $\pi$ multiplied by the inverse of the mixer arrangement clock rate if the phase deviation is given in radians.

The in-phase mixer may be adapted to multiply the in-phase mixer input signal with the in-phase mixer translation sequence to produce the in-phase mixer output signal, and the quadrature-phase mixer may be adapted to multiply the quadrature-phase mixer input signal with the quadrature-phase mixer translation sequence to produce the quadrature-phase mixer output signal.

According to some embodiments, the in-phase and quadrature-phase mixers may be implemented by respective variable conductance circuits, each having the respective mixer translation sequences as a control input signal. Each of the variable conductance circuits may be a transconductor and have a variable transconductance. For example, each of the variable conductance circuits may be implemented by one or more transistors. Alternatively, each of the variable conductance circuits may be implemented by resistors.

In some embodiments, the one or more correction networks may be further adapted to compensate for an amplitude deviation by adjusting at least one of the in-phase mixer input signal, the quadrature-phase mixer input signal, the in-phase mixer output signal, and the quadrature-phase mixer output signal.

The one or more correction networks may be adapted to perform the adjustment by scaling operations and adding operations, wherein the scaling operations are based on the phase deviation, and possibly an amplitude deviation.

The mixer arrangement may, in some embodiments, be adapted to down-convert the mixer arrangement input signal to produce the mixer arrangement output signal having an in-phase component and a quadrature-phase component. In such embodiments, the mixer arrangement input signal may be used as the in-phase mixer input signal and as the quadrature-phase mixer input signal, and the one or more correction networks may be adapted to adjust at least one of the in-phase mixer output signal and the quadrature-phase mixer output signal and output the in-phase component and the quadrature-phase component of the mixer arrangement output signal.

According to some embodiments, the mixer arrangement input signal may have an in-phase component and a quadrature-phase component and may comprise two carrier aggregation components. In such embodiments, the mixer arrangement may be adapted to down-convert the mixer arrangement input signal to produce the mixer arrangement output signal, the mixer arrangement output signal having an in-phase component and a quadrature-phase component for each of the carrier aggregation components. The at least one mixer pairs may comprise a first mixer pair using the in-phase component of the mixer arrangement input signal as the in-phase mixer input signal and as the quadrature-phase mixer input signal, and a second mixer pair using the quadrature-phase component of the mixer arrangement input signal as the in-phase mixer input signal and as the quadrature-phase mixer input signal. The one or more correction networks may be adapted to, for each of the mixer pairs, adjust at least one of the in-phase mixer output signal and the quadrature-phase mixer output signal and output respective in-phase and quadrature-phase correction network output signals. In these embodiments, the mixer arrangement may further comprise a carrier aggregation separation network adapted to produce the mixer arrangement output signal based on the in-phase and quadrature-phase correction network output signals of the first and second mixer pairs.

In some embodiments, the mixer arrangement input signal may have an in-phase component and a quadrature-phase component and comprise two carrier aggregation components. The mixer arrangement may be adapted to down-convert the mixer arrangement input signal to produce the mixer arrangement output signal having an in-phase component and a quadrature-phase component for each of the carrier aggregation components. In these embodiments, the at least one mixer pairs may comprise a first mixer pair using the in-phase component of the mixer arrangement input signal as the in-phase mixer input signal and as the quadrature-phase mixer input signal, and a second mixer pair using the quadrature-phase component of the mixer arrangement input signal as the in-phase mixer input signal and as the quadrature-phase mixer input signal. The one or more correction networks may be adapted to produce the mixer arrangement output signal based on the in-phase and quadrature-phase mixer output signals of the first and second mixer pairs, wherein producing the mixer arrangement output signal comprises compensating for the phase deviation, compensating for an in-phase/quadrature-phase imbalance present in the mixer arrangement input signal, and providing carrier aggregation separation. The in-phase/quadrature-phase imbalance present in mixer arrangement input signal may comprise one or both of an amplitude imbalance and a phase imbalance.

In yet some embodiments, the mixer arrangement may be adapted to up-convert the mixer arrangement input signal to produce the mixer arrangement output signal, the mixer arrangement input signal having an in-phase component and a quadrature-phase component. The one or more correction networks may be adapted to adjust at least one of the in-phase component and the quadrature-phase component of the mixer arrangement input signal, and output the in-phase mixer input signal and the quadrature-phase mixer input signal. According to these embodiments, the mixer arrangement output signal may comprise the in-phase mixer output signal and the quadrature-phase mixer output signal.

The quadrature mixer arrangement may, in some embodiments, be an intermediate frequency mixer. Thus the translation frequency may be an intermediate frequency.

The quadrature mixer arrangement may be a complex mixer arrangement according to some embodiments.

A second aspect is a wireless communication receiver comprising the mixer arrangement of the first aspect, and a third aspect is a wireless communication transmitter comprising the mixer arrangement of the first aspect.

A fourth aspect is a wireless communication modem comprising at least one of the mixer arrangement of the first aspect, the receiver of the second aspect, and the transmitter of the third aspect.

A fifth aspect is a wireless communication device comprising at least one of the mixer arrangement of the first aspect, the receiver of the second aspect, the transmitter of the third aspect, and the modem of the fourth aspect.

An advantage of some embodiments is that high image rejection performance of harmonic rejection mixer arrangements with time-discrete translation frequency signal representation and arbitrary over-sampling rate is enabled. Thus, the mixer arrangement may apply a larger range of translation frequencies compared to if the over-sampling rate has to be a multiple of 4, which gives higher flexibility.

Another advantage of some embodiments is that spectrum aliases due to the time-discrete translation frequency signal may be more freely positioned in frequency when more over-sampling rates are available. Hence, positioning an alias frequency close to or at a strong interfering signal may be avoided to a larger extent, obviating that the strong interfering signal is converted to co-channel interference.

Another advantage of some embodiments is that errors caused by amplitude-discrete representations may also be handled.

A further advantage of some embodiments is that the flexibility with respect to frequency planning may be increased. This is since arbitrary over-sampling rates may be handled according to the embodiments; it is possible to achieve good image rejection for a larger range of carrier frequency combinations.

Yet a further advantage of some embodiments is that the correction due to arbitrary over-sampling rate may be combined with other corrections and compensations to a compact implementation.

BRIEF DESCRIPTION OF THE DRAWINGS

Further objects, features and advantages will appear from the following detailed description of embodiments, with reference being made to the accompanying drawings, in which.

DETAILED DESCRIPTION

In the following, embodiments will be described where a quadrature mixer arrangement is operable with an arbitrary over-sampling rate. This is particularly beneficial in harmonic rejection mixers, where the increased flexibility with regard to over-sampling rate results in better possibilities to avoid interference of the desired signal.

Some embodiments apply one or more correction networks, which may be applied before and/or after the mixing operation, that adjust the signals so that the influence of imperfections in the translation signals (LO signals) is counteracted. Such imperfections may be due to amplitude discretization (i.e. quantization) of the translation signal representation. Furthermore, the imperfections may be due to time discretization of the translation signal representation in combination with the applied over-sampling rate.

Figure 2:
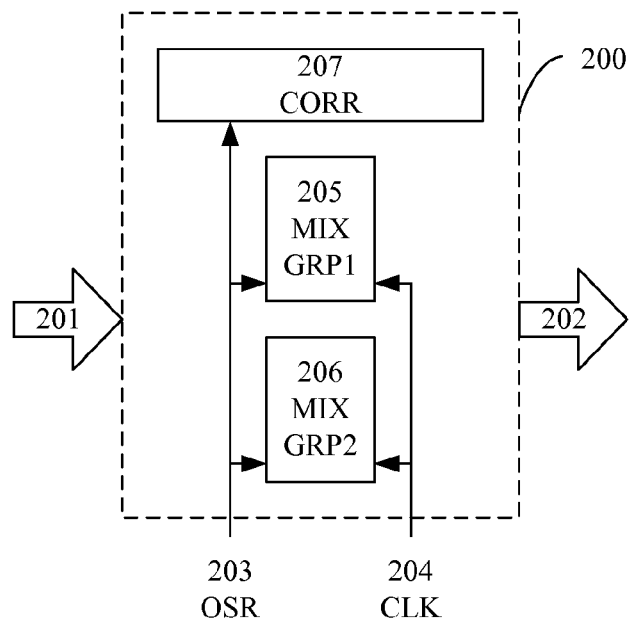
FIG. 2 is a schematic block diagram illustrating an example generic implementation of a mixer arrangement according to some embodiments.

FIG. 2 schematically illustrates an example generic implementation of a mixer arrangement 200 according to some embodiments. The mixer arrangement 200 has one or more input signals 201 and provides one or more output signals 202 which are generated based on the input signals. The mixer arrangement 200 comprises two groups of mixers (MIX GRP1, MIX GRP2) 205, 206 and one or more correction networks (CORR) 207. The two groups of mixers may, for example, be a group of in-phase mixers and a group of quadrature-phase mixers.

In this example, the mixers of the two groups are operated at a clock rate provided by a clock signal (CLK) 204. The transfer frequency signals in this example are typically represented by a respective sequence of values that corresponds to a sampled (and possibly quantized) sinusoid transfer frequency signal. In each clock cycle of the clock signal, a value of the respective sequence is applied as a scaling factor to the respective input signal of each mixer, which represents a frequency translation by the translation frequency.

The over-sampling rate (the number of clock cycles per translation frequency period) may be used to control the two groups of mixers 205, 206 (e.g. by selection of appropriate sequences to represent the transfer frequency signals) and the one or more correction networks 207 via a control signal (OSR) 203 (e.g. by adaptation of applied adjustment parameters).

Figure 3:
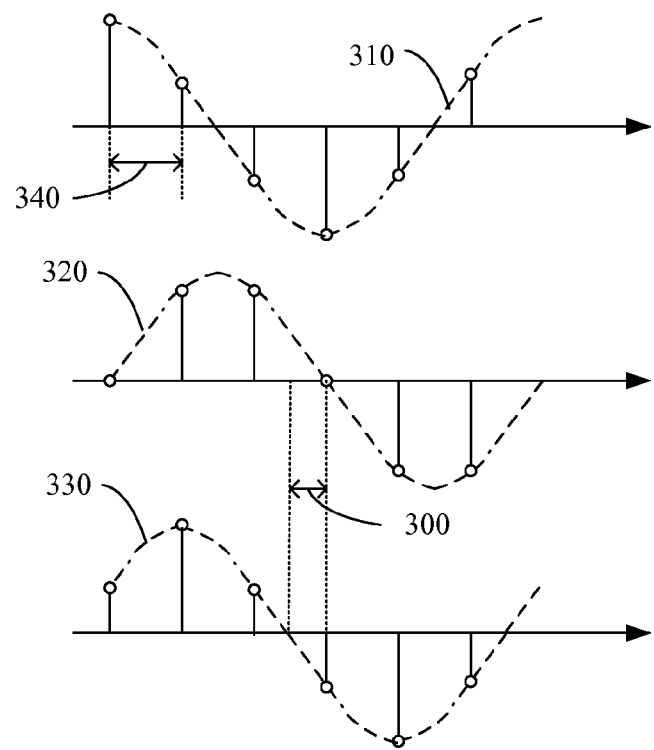
FIG. 3 is a plot illustrating sampling of an in-phase translation frequency signal and a quadrature-phase translation frequency signal according to some embodiments.

FIG. 3 illustrates various sampling approaches of a translation frequency signal 310, 320, 330. The sample values may (possibly after quantization) be used as values in the sequences representing the transfer frequency signals. In this example, the sample period 340 (which corresponds to a clock cycle) is ⅙ of the translation frequency period, i.e. the over-sampling rate is 6.

The signal 310 may represent an in-phase translation frequency signal and the signal 320 may represent a quadrature-phase translation frequency signal. The phase difference between the signal 310 and the signal 320 is exactly $\pi/2$.

Generally, assuming an integer over-sampling rate (OSR), the samples values of one period of two time-discrete LO waveforms in quadrature may be defined as $s_{LO,I}(N)=\cos(2\pi N/OSR)$ and $s_{LO,Q}(N)=\sin(2\pi N/OSR)$, for N=0, 1, . . . , OSR−1.

As can be seen form FIG. 3, the values of the sample sequence representing the in-phase signal ([1 0.5 −0.5 −1 −0.5 0.5]) are different from the values of the sample sequence representing the quadrature-phase signal ([0 0.866 0.866 0 −0.866 −0.866]).

It is typically more efficient to be able to use the same sequence values, properly shifted in relation to each other, for both in-phase and quadrature-phase mixers. It is more efficient to store one sequence than two sequences. Furthermore, a smaller number of quantization levels required to represent the in-phase and quadrature-phase sequences decreases the resolution needed.

If, for example, the over-sampling rate in FIG. 3 was 8, the values of the sample sequence representing the in-phase and quadrature-phase signals could be the same shifted by two positions relative each other (e.g. [1 0.707 0 −0.707 −1 −0.707 0 0.707] and [0 0.707 1 0.707 0 −0.707 −1 −0.707] respectively). Similar observations may be made for any over-sampling rate which is a multiple of 4. Thus, in order to obtain the same sampled sequence for in-phase and quadrature-phase signals, the over-sampling rate should be a multiple of 4, which is due to the fact that $s_{LO,Q}(N)=\sin(2\pi N/OSR)=\cos(2\pi N/OSR+\pi/2)=\cos(2\pi(N+OSR/4)/OSR)=s_{LO,I}(N+OSR/4)$.

On the other hand, it is desirable (e.g. due to harmonic rejection performance optimization) to be able to use over-sampling rates that are not a multiple of 4. The number of over-sampling rates available is typically upper limited by the frequency of the clock driving the mixers and/or generating the translation frequency signals. Furthermore, increasing the over-sampling rate also means increasing the number of amplitude quantization levels required to represent the in-phase and quadrature-phase sequences, thus decreasing efficiency in a similar manner as explained above. Thus, there is typically a limited number of over-sampling values available and a restriction regarding the over-sampling rate being a multiple of 4 may result in very low flexibility with regard to harmonic rejection performance optimization.

Thus, in the example of FIG. 3, one would like to be able to use [1 0.5 −0.5 −1 −0.5 0.5] as the in-phase sequence and [0.5 1 0.5 −0.5 −1 −0.5] as the quadrature-phase sequence (compare with sampling of the signals 310 and 330). However, doing so would result in a phase error 300, i.e. a deviation from the optimal $\pi/2$ phase difference between in-phase and quadrature-phase references. Application of one or more correction networks may compensate for such a deliberate phase error, thus allowing over-sampling rates that are not a multiple of 4 while not compromising on performance.

Although this example has illustrated a situation where a deliberate phase error appears due to the same sequence values being used for in-phase and quadrature-phase, embodiments are equally applicable even if the in-phase and quadrature-phase sequences do not comprise the same sequence values. For example, an over-sampling rate and a deliberate phase error may be selected to optimize harmonic rejection properties of the mixer arrangement. Even if such a selection results in different values in the in-phase and quadrature-phase sequences, the use of one or more correction networks to compensate for the deliberate phase error according to some embodiments is still applicable.

It is to be noted that in the general case there is typically also a deliberate amplitude (or gain) deviation between the in-phase and quadrature-phase sequences. The amplitude deviation may, for example, be due to quantization when the in-phase and quadrature-phase sequences do not comprise the same sequence values. Many of the examples herein only mention the deliberate phase deviation. However, this is not meant to exclude the presence of (and compensation for) a deliberate amplitude deviation.

Figure 4:
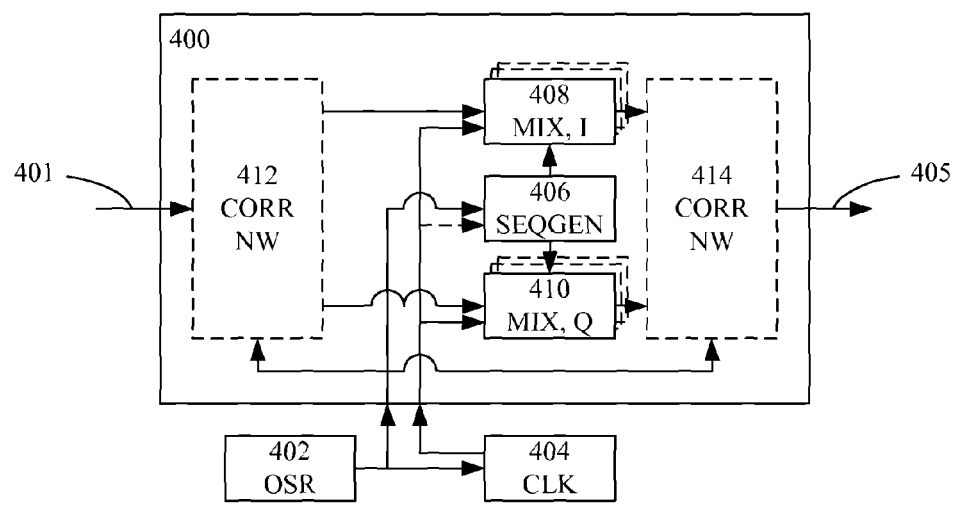
FIG. 4 is a schematic block diagram illustrating an example generic implementation of a mixer arrangement according to some embodiments.

FIG. 4 schematically illustrates an example mixer arrangement 400 according to some embodiments. The mixer arrangement 400 may be seen as a special case of the generic implementation example mixer arrangement 200 of FIG. 2.

The mixer arrangement 400 has one or more input signals 401 and provides one or more output signals 405 which are generated based on the input signals. The mixer arrangement 400 comprises a group of in-phase mixers (MIX, I) 408 and a group of quadrature-phase mixers (MIX, Q) 410 and one or more correction networks (CORR NW) 412, 414. The correction operations of the correction networks may be applied before (412) and/or after (414) the mixing operations, as will also be demonstrated by examples later herein.

An over-sampling rate unit (OSR) 402 and a clock signal generator (CLK) 404 are associated with the mixer arrangement 400. In some embodiments one or more of the over-sampling rate unit 402 and a clock signal generator 404 may be comprised in the mixer arrangement 400.

The over-sampling rate unit 402 provides the over-sampling rate to the clock signal generator 404 and to a sequence generator (SEQGEN) 406 associated with or integral to the mixers of the mixer arrangement 400. The over-sampling rate may, for example, be selected based on desired harmonic and/or image rejection properties of the mixer arrangement.

Based on the over-sampling rate, the clock signal generator provides a clock signal whose clock rate equals the translation frequency to be applied by the mixer arrangement multiplied by the over-sampling rate. The clock signal generator may operate according to any known of future method to produce the clock signal. The clock signal is provided to the mixer arrangement 400 and is used for operating at least the mixers 408, 410 and the one or more correction networks 412, 414.

The sequence generator 406 is adapted to provide respective sequences to the in-phase and quadrature-phase mixers, the sequences representing respective translation frequency sinusoidal functions after sampling and possibly quantization (compare with FIG. 3). The sequences are provided based on the over-sampling rate, which defines the number of samples per translation frequency function period. There may be one or more available sequences for a given over-sampling rate (i.e. different sampling phase). Furthermore, for a given in-phase sequence, there may be one or more available quadrature-phase sequence (i.e. different phase deviations). The selection of which of the available combinations to use may, for example, be based on desired harmonic and/or image rejection properties of the mixer arrangement. The selection and/or the available combinations may be subject to a condition that the absolute value of the phase deviation should be minimized. In some embodiments, the available combinations comprise only combinations where the phase deviation is less than or equal to an inverse of the mixer arrangement clock rate (i.e. the sampling period) divided by 2. Table 1 illustrates possible phase deviations (PD) with minimal absolute value for a number of different over-sampling rates (OSR) when the in-phase and quadrature-phase sequences are identical apart from a position shift.

TABLE 1

| OSR | PD (degrees) |
|---|---|
| 6 | {−30, 30} |
| 7 | 12.86 |
| 8 | 0 |
| 9 | −10 |
| 10 | {−18, 18} |
| 11 | 8.18 |
| 12 | 0 |
| 13 | −6.92 |
| 14 | {−12.86, 12.86} |
| 15 | 6 |
| 16 | 0 |
| 17 | −5.29 |
| 18 | {−10, 10} |
| 19 | 4.74 |
| 20 | 0 |

The respective sequences are then used by the mixers to frequency translate the input signals according to any known or future method based on the clock signal. Typically, the in-phase mixers are operated to give frequency translation with a first LO phase and the quadrature-phase mixers are operated to give frequency translation with a second LO phase which has close to a quadrature phase relation with the first LO phase.

The one or more correction networks 412, 414 compensate for the deliberate imperfections. The deliberate imperfections may be caused by having an over-sampling rate that is not a multiple of 4, by quantization and/or by selecting a particular in-phase/quadrature-phase sequence pair.

The compensation may be performed according to any known or future method and a few examples will be described herein. Typically the compensation is based on the over-sampling rate (illustrated by provision of the over-sampling rate to the correction networks 412 and 414 in FIG. 4) and the phase deviation of the in-phase/quadrature-phase sequence pair (e.g. provided to the correction networks by the sequence generator, not shown in FIG. 4). For example, the compensation may be performed by scaling operations and adding operations as will be exemplified further herein, wherein the scaling operations are based on the phase deviation (and a possible amplitude deviation).

As long as the sequences are well-defined with respect to their amplitude and phase relations, the configuration of the one or more correction networks follows implicitly. In embodiments where pre-calculated sequences are applied, the applicable correction parameters (see examples in FIGS. 6-10) may also be pre-calculated and stored in a memory.

Thus, some embodiments (see e.g. FIGS. 2 and 4) provide a mixer arrangement with two groups of time discrete and amplitude discrete harmonic rejection mixers, the two groups of harmonic rejection mixers having respective equivalent LO waveforms represented by an over-sampling rate that is not a multiple of four. The equivalent LO waveforms may be selected to provide at least a specified level of harmonic rejection and the correction networks may be configured such that the resulting equivalent LO waveforms have the same magnitude and a quadrature phase relationship.

Figures 5A, 5B:
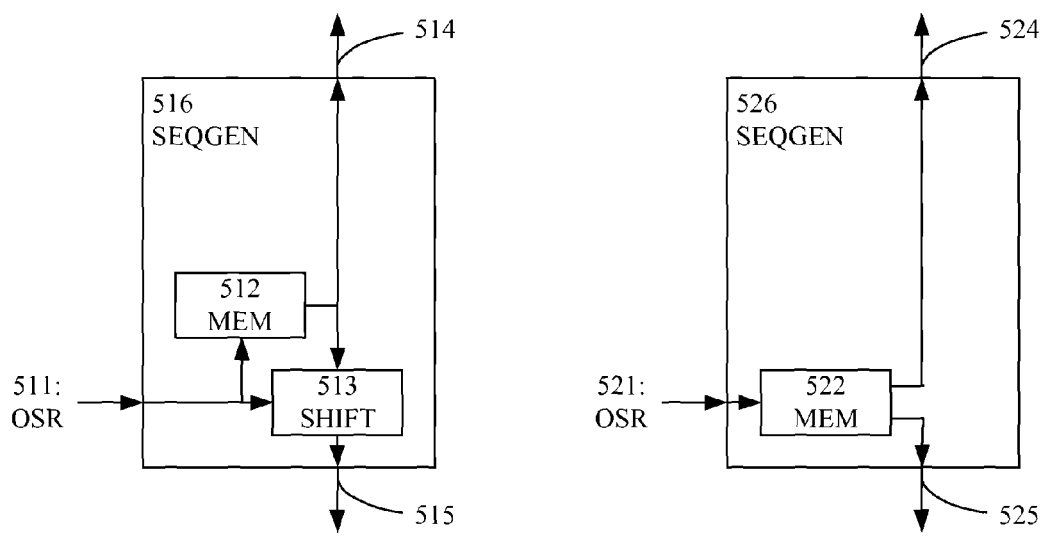
FIGS. 5A and 5B are schematic block diagrams illustrating example implementations of a sequence generator according to some embodiments.

FIGS. 5A and 5B illustrate two example implementations 516, 526 of a sequence generator according to some embodiments. Any of the example sequence generators may, for example, be used as the sequence generator 406 of FIG. 4.

The sequence generator 516, 526 addresses a memory (MEM) 512, 522 based on the over-sampling rate 511, 521 to provide at least one of the in-phase and quadrature-phase sequences. If there are several available sequences and combinations of sequences other parameters may be used to complement the over-sampling rate when addressing the memory (not shown in FIGS. 5A and 5B). On the other hand, if there is only one available sequence and combination of sequences, the over-sampling rate (or an indication thereof) may be sufficient.

FIG. 5A illustrate the case where the in-phase and quadrature-phase sequences are identical aside from a shift in positions. In this case, the memory 512 need only store and output one of the sequences (e.g. the in-phase sequence 514 as illustrated in FIG. 5A). A shifter (SHIFT) 513 may produce the other sequence (e.g. the quadrature-phase sequence 515 as illustrated in FIG. 5A) by shifting the sequence output by the memory based on the over-sampling rate 511. The number of positions that the sequence is shifted corresponds to a phase of the translation frequency period, and the phase deviation may typically be defined as that phase minus π/2, or vice versa.

FIG. 5B illustrate a more general case where the in-phase and quadrature-phase sequences may or may not be identical aside for a phase shift. In this case, the memory 522 stores and outputs both the in-phase sequence 524 and the quadrature-phase sequence 525 based on the over-sampling rate 521.

Some example mixer arrangements will be presented in FIGS. 6-10. A mixer arrangement may, for example, represent any of a quadrature up-conversion or down-conversion mixer, a complex up-conversion or down-conversion mixer, and/or an image rejection up-conversion or down-conversion mixer. An example down-conversion mixer arrangement (see e.g. FIGS. 6, 8 and 10) has at least one input signal and at least two output signals, and at least one correction network after the mixers. An example up-conversion mixer arrangement (see e.g. FIG. 7) has at least two input signals and at least one output signal, and at least one correction network before the mixers.

Figure 6:
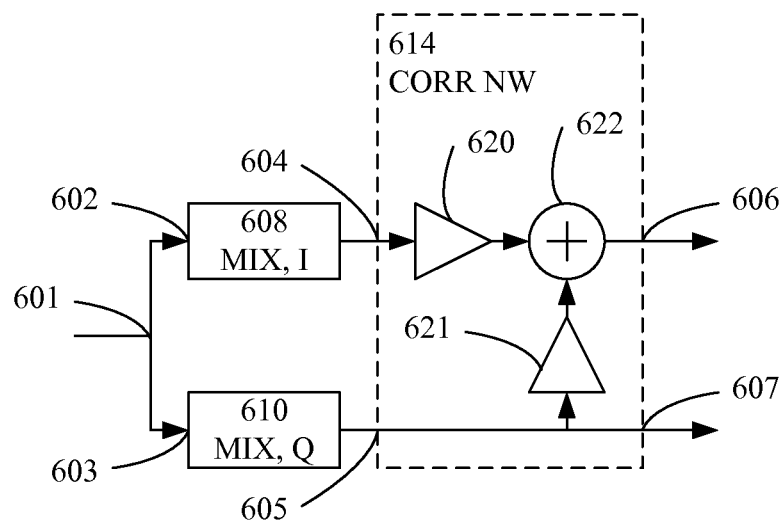
FIG. 6 is a schematic block diagram illustrating an example implementation of a quadrature down-conversion mixer arrangement according to some embodiments.

FIG. 6 illustrates an example implementation of a quadrature down-conversion mixer arrangement with a corresponding correction network 614 according to some embodiments. A mixer input signal 601, 602, 603 is provided to an in-phase mixer circuit (MIX, I) 608 and a quadrature-phase mixer circuit (MIX, Q) 610. The mixer input signal 601 is input to the in-phase mixer circuit 608 as an in-phase mixer input signal 602 and to the quadrature-phase mixer circuit 610 as a quadrature-phase mixer input signal 603. The in-phase and quadrature-phase mixer circuits down-convert the mixer input signal 601 by the translation frequency and may, for example, operate based on sequences representing respective LO waveforms as has been explained above. The mixer pair 608, 610 have a gain imbalance A (ideally equal to 1) and a phase imbalance $\phi$ (ideally equal to 0, i.e. the phase deviation referred to above). As explained above, the imbalance may be due to an over-sampling rate which is not a multiple of 4 and/or due to a phase deviation of the sequences and/or due to quantization losses.

The output signals 604, 605 of the mixer pair are input to the correction network 614 which in turn provides a mixer arrangement output signal having an in-phase component 606 and a quadrature-phase component 607. In the example of FIG. 6, the quadrature-phase component 607 of the mixer arrangement output signal equals the quadrature-phase mixer output signal 605. The in-phase component 606 of the mixer arrangement output signal equals a summation 622 of the in-phase mixer output signal 604 scaled by a scaling unit 620 and the quadrature-phase mixer output signal 605 scaled by a scaling unit 621. In other implementations, the in-phase mixer output signal 604 may be output directly and the quadrature-phase component 607 of the mixer arrangement output signal may be an adjusted signal.

If the in-phase sequence represents $A\cos(\omega t+\phi)$ and the quadrature-phase sequence represents $\sin(\omega t)$, then the scaling unit 620 may apply a scaling factor of $1/(A\cos(\phi))$ and the scaling unit 621 may apply a scaling factor of $\tan(\phi)$.

Figure 7:
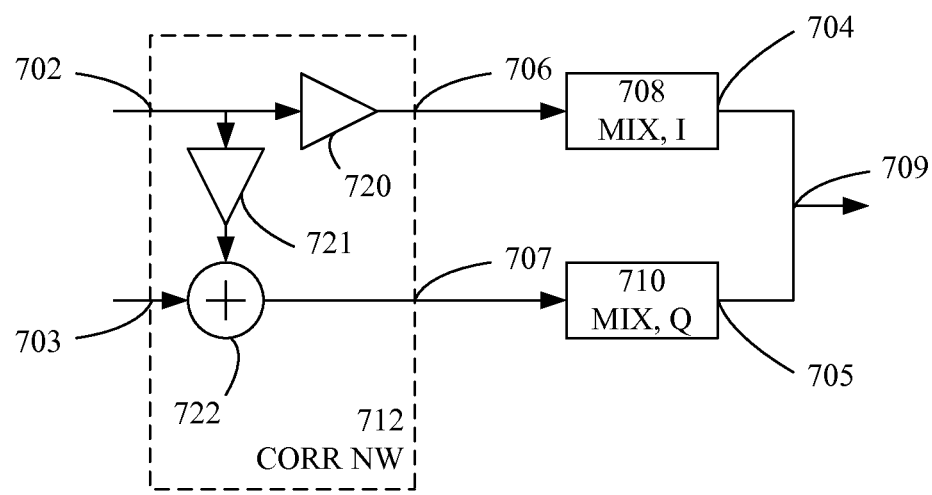
FIG. 7 is a schematic block diagram illustrating an example implementation of a quadrature up-conversion mixer arrangement according to some embodiments.

FIG. 7 illustrates an example implementation of a quadrature up-conversion mixer arrangement with a corresponding correction network 712 according to some embodiments. A mixer arrangement input signal having an in-phase component 702 and a quadrature-phase component 703 is input to the correction network 712 which provides an in-phase mixer input signal 706 to an in-phase mixer circuit (MIX, I) 708 and a quadrature-phase mixer input signal 707 to a quadrature-phase mixer circuit (MIX, Q) 710. The in-phase and quadrature-phase mixer circuits up-convert the respective mixer input signals 706, 707 by the translation frequency and may, for example, operate based on sequences representing respective LO waveforms as has been explained above. The mixer pair 708, 710 have a gain imbalance A (ideally equal to 1) and a phase imbalance $\phi$ (ideally equal to 0, i.e. the phase deviation referred to above). As explained above, the imbalance may be due to an over-sampling rate which is not a multiple of 4 and/or due to a phase deviation of the sequences and/or due to non-identical in-phase and quadrature-phase sequence values and/or due to quantization losses.

In the example of FIG. 7, the in-phase mixer input signal 706 equals the in-phase mixer arrangement input signal 702 scaled by a scaling unit 720. The quadrature-phase mixer input signal 707 equals a summation 722 of the quadrature-phase mixer arrangement input signal 703 and the in-phase mixer arrangement input signal 702 scaled by a scaling unit 721. In other implementations, the implementation of the correction network may be reversed with regard to the in-phase and quadrature-phase paths.

If the in-phase sequence represents $A\cos(\omega t+\phi)$ and the quadrature-phase sequence represents $\sin(\omega t)$, then the scaling unit 720 may apply a scaling factor of $1/(A\cos(\phi))$ and the scaling unit 721 may apply a scaling factor of $\tan(\phi)$.

Figure 1A:
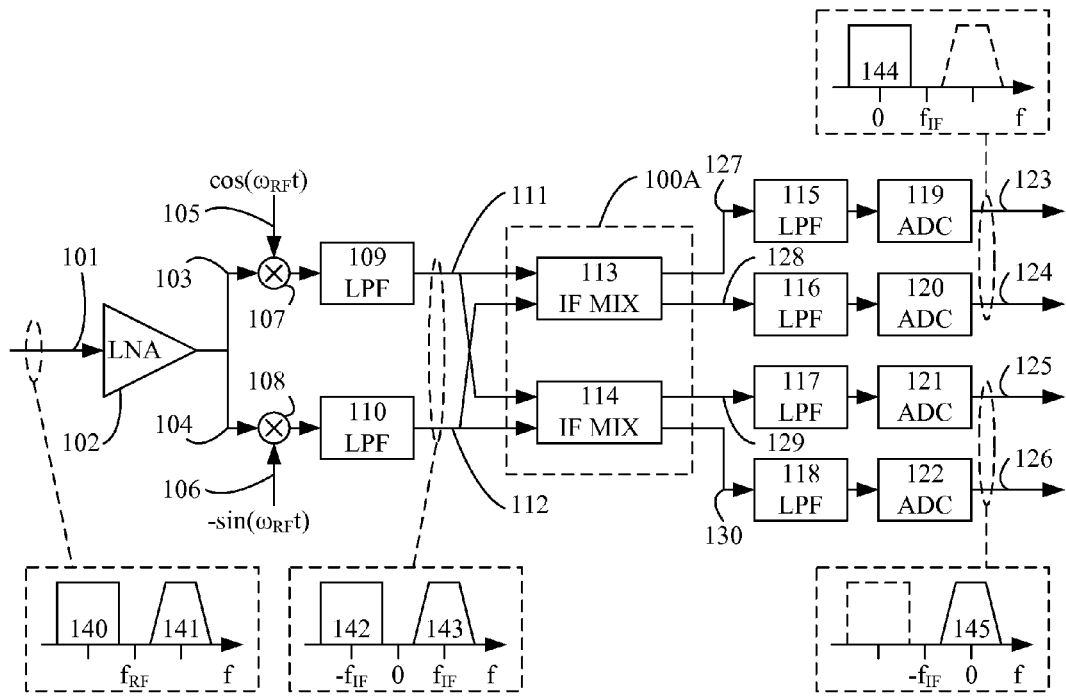
FIG. 1A is a schematic block diagram illustrating an example complex intermediate frequency (IF) dual carrier receiver according to some embodiments.
Figure 1B:
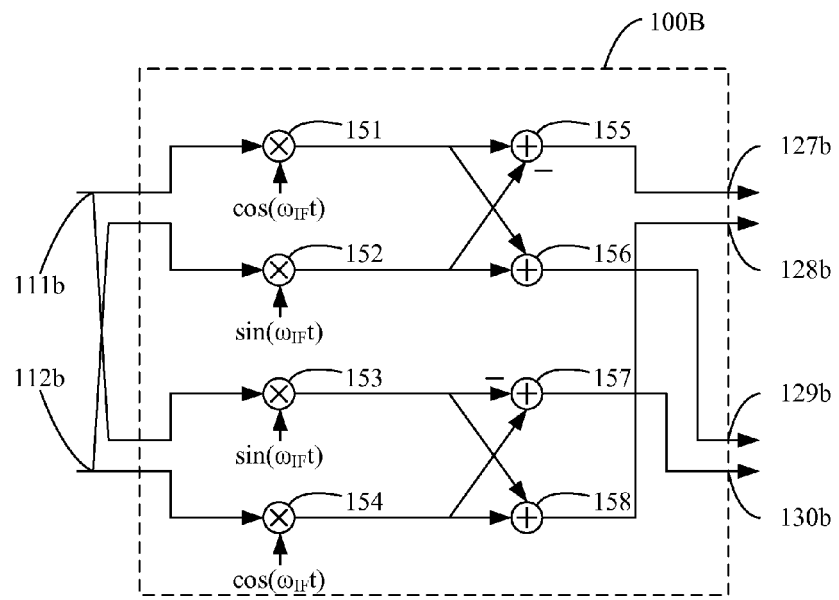
FIG. 1B is a schematic block diagram illustrating an example implementation of a complex IF mixer for dual carrier reception according to some embodiments.
Figure 8:
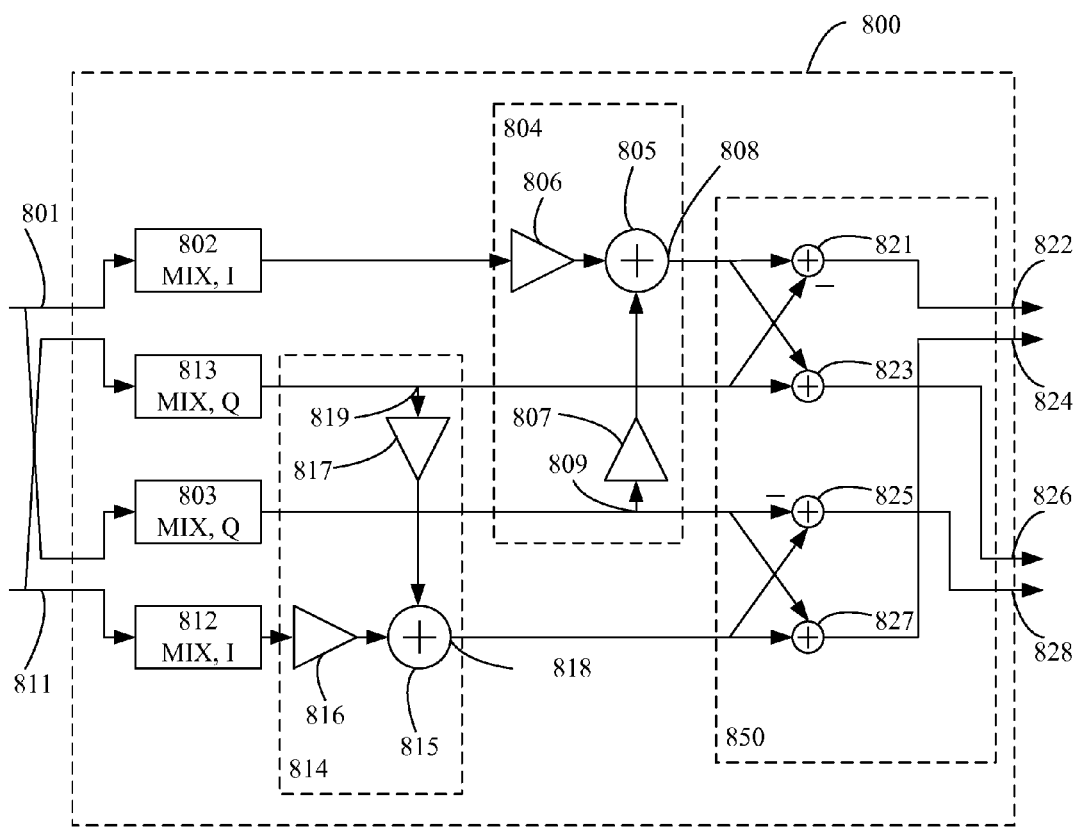
FIG. 8 is a schematic block diagram illustrating an example implementation of a complex down-conversion mixer arrangement for dual-carrier reception according to some embodiments.

FIG. 8 illustrates an example implementation of a complex down-conversion mixer arrangement 800 for dual-carrier reception with corresponding correction networks 804, 814 according to some embodiments (compare with FIG. 1B).

An in-phase mixer input signal 801 is provided to an in-phase mixer circuit (MIX, I) 802 and a quadrature-phase mixer circuit (MIX, Q) 803. The in-phase and quadrature-phase mixer circuits 802, 803 down-convert the mixer input signal 801 by the translation frequency and may, for example, operate based on sequences representing respective LO waveforms as has been explained above. The output signals of the mixer pair 802, 803 are input to the correction network 804, which provides corresponding corrected signals 808, 809. In the example of FIG. 8, the corrected quadrature-phase component 809 equals the output of the quadrature-phase mixer 803. The corrected in-phase component 808 equals a summation 805 of the output of the in-phase mixer 802 scaled by a scaling unit 806 and the output of the quadrature-phase mixer 803 scaled by a scaling unit 807. In other implementations, the implementation of the correction network 804 may be reversed with regard to the in-phase and quadrature-phase paths.

In a similar manner, a quadrature-phase mixer input signal 811 is provided to an in-phase mixer circuit (MIX, I) 812 and a quadrature-phase mixer circuit (MIX, Q) 813. The in-phase and quadrature-phase mixer circuits 812, 813 down-convert the mixer input signal 811 by the translation frequency and may, for example, operate based on sequences representing respective LO waveforms as has been explained above. The output signals of the mixer pair 812, 813 are input to the correction network 814, which provides corresponding corrected signals 818, 819. In the example of FIG. 8, the corrected quadrature-phase component 819 equals the output of the quadrature-phase mixer 813. The corrected in-phase component 818 equals a summation 815 of the output of the in-phase mixer 812 scaled by a scaling unit 816 and the output of the quadrature-phase mixer 813 scaled by a scaling unit 817. In other implementations, the implementation of the correction network 814 may be reversed with regard to the in-phase and quadrature-phase paths.

If the gain and phase imbalance of the mixer pairs (802, 803) and (812, 813) is manifested by the in-phase sequence representing $A\cos(\omega t+\phi)$ and the quadrature-phase sequence representing $\sin(\omega t)$, then the scaling units 806, 816 may apply a scaling factor of $1/(A\cos(\phi))$ and the scaling units 807, 817 may apply a scaling factor of $\tan(\phi)$.

After correction, the complex mixer arrangement output signals 822, 824 and 826, 828 of the two carrier components are created in a similar manner as in FIG. 1B using a carrier aggregation separation network 850 comprising summation units 821, 823, 825, 827.

Figure 9:
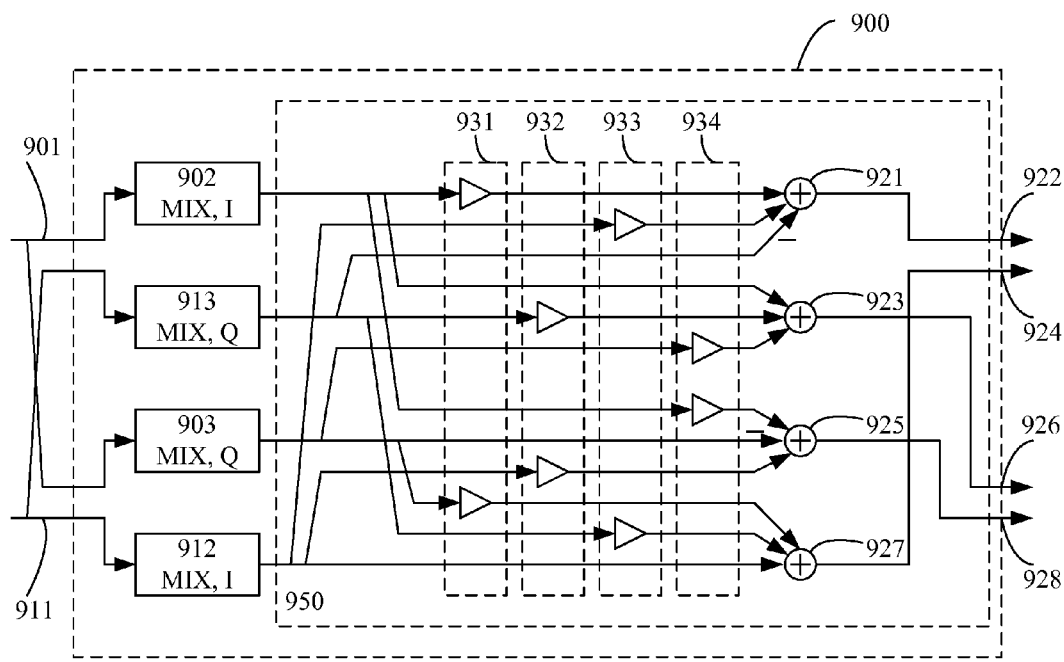
FIG. 9 is a schematic block diagram illustrating an example implementation of a complex down-conversion mixer arrangement for dual-carrier reception with correction for IQ imbalance present in the mixer arrangement input signal.
Figure 10:
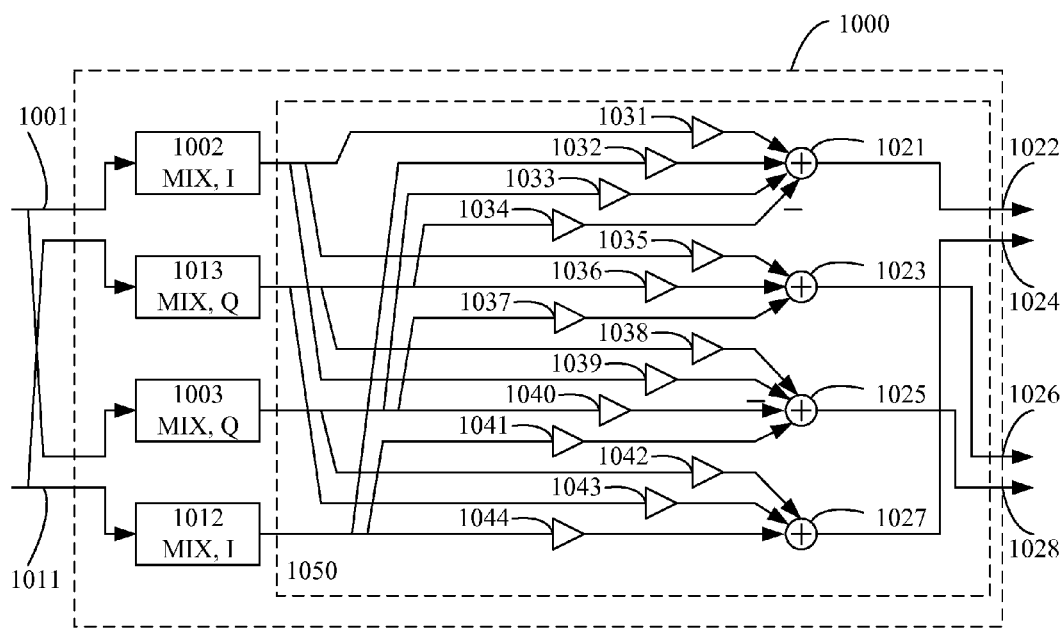
FIG. 10 is a schematic block diagram illustrating an example implementation of a complex down-conversion mixer arrangement for dual-carrier reception with combined correction according to some embodiments.

FIGS. 9 and 10 illustrate how correction of the deliberate imperfections described above can be densely combined with correction of other (non-deliberate) imperfections. The other imperfections may, for example, be due to component mismatch and may, for example, comprise an IQ imbalance of a complex signal used as input to the mixer (i.e. originating from circuitry—e.g. an RF mixer—preceding the mixer).

FIG. 9 illustrates an example implementation of a complex down-conversion mixer arrangement 900 for dual-carrier reception with correction for IQ imbalance in an RF mixer preceding the complex down-conversion mixer.

An in-phase mixer input signal 901 is provided to an in-phase mixer circuit (MIX, I) 902 and a quadrature-phase mixer circuit (MIX, Q) 903. In a similar manner, a quadrature-phase mixer input signal 911 is provided to an in-phase mixer circuit (MIX, I) 912 and a quadrature-phase mixer circuit (MIX, Q) 913. The mixer circuits 902, 903, 912, 913 down-convert the mixer input signals 901, 911 by the translation frequency and may, for example, operate based on sequences representing respective LO waveforms as has been explained above.

The output of the mixer circuits 902, 903, 912, 913 are input to a correction network 950, which is a combination of adjustments for IQ imbalance in an RF mixer preceding the complex down-conversion mixer and a carrier aggregation separation network similar to 850 of FIG. 8, to provide the complex mixer arrangement output signals 922, 924 and 926, 928 of the two carrier components. One implementation of the correction network 950 may be found in L. Sundström, et al., "Complex IF harmonic rejection mixer for non-contiguous dual carrier reception in 65 nm CMOS," IEEE European Solid-State Circuits Conference, September 2012.

As illustrated in FIG. 9, the correction network 950 may comprise appropriate summations 921, 923, 925, 927 of the output of the mixer circuits 902, 903, 912, 913 properly scaled in scaling units 931, 932, 933, 934.

FIG. 10 illustrates an example implementation of a complex down-conversion mixer arrangement 1000 for dual-carrier reception with a correction network 1050 which is a combination of the correction networks 804, 814 of FIG. 8 and the correction network 950 of FIG. 9. Thus, this example architecture is capable of correcting both for IQ imbalance in the RF mixer and in the complex mixer itself.

An in-phase mixer input signal 1001 is provided to an in-phase mixer circuit (MIX, I) 1002 and a quadrature-phase mixer circuit (MIX, Q) 1003. In a similar manner, a quadrature-phase mixer input signal 1011 is provided to an in-phase mixer circuit (MIX, I) 1012 and a quadrature-phase mixer circuit (MIX, Q) 1013. The mixer circuits 1002, 1003, 1012, 1013 down-convert the mixer input signals 1001, 1011 by the translation frequency and may, for example, operate based on sequences representing respective LO waveforms as has been explained above.

The output of the mixer circuits 1002, 1003, 1012, 1013 are input to a correction network 1050, which is a combination of adjustments for IQ imbalance in an RF mixer preceding the complex down-conversion mixer, a carrier aggregation separation network similar to 850 of FIG. 8, and the correction networks 804, 818 of FIG. 8, to provide the complex mixer arrangement output signals 1022, 1024 and 1026, 1028 of the two carrier components.

The in-phase output signal 1022 of the first carrier component is produced as a summation 1021 of:
  the output signal of the in-phase mixer 1002 scaled by 1031 a sum of $1/(A\cos(\phi))$ and the scaling factor of 931 in FIG. 9,
  the output signal of the in-phase mixer 1012 scaled by 1032 a product of $1/(A\cos(\phi))$ and the scaling factor of 933 in FIG. 9,
  the output signal of the quadrature-phase mixer 1003 scaled by 1033 a product of $\tan(\phi)$ and the scaling factor of 931 in FIG. 9, and
  the output signal of the quadrature-phase mixer 1013 scaled by 1034 a difference between a product of $\tan(\phi)$ and the scaling factor of 933 in FIG. 9, and one.

The quadrature-phase output signal 1024 of the first carrier component is produced as a summation 1027 of:
  the output signal of the in-phase mixer 1012 scaled by 1044 $1/(A\cos(\phi))$,
  the output signal of the quadrature-phase mixer 1003 scaled by 1042 the scaling factor of 931 in FIG. 9, and
  the output signal of the quadrature-phase mixer 1013 scaled by 1043 a sum of $\tan(\phi)$ and the scaling factor of 933 in FIG. 9.

The in-phase output signal 1026 of the first carrier component is produced as a summation 1023 of:
  the output signal of the in-phase mixer 1002 scaled by 1035 $1/(A\cos(\phi))$,
  the output signal of the quadrature-phase mixer 1003 scaled by 1037 a sum of $\tan(\phi)$ and the scaling factor of 934 in FIG. 9, and
  the output signal of the quadrature-phase mixer 1013 scaled by the scaling factor of 932 in FIG. 9.

The quadrature-phase output signal 1028 of the first carrier component is produced as a summation 1025 of:
  the output signal of the in-phase mixer 1002 scaled by 1039 a product of $1/(A\cos(\phi))$ and the scaling factor of 934 in FIG. 9,
  the output signal of the in-phase mixer 1012 scaled by 1041 a sum of $1/(A\cos(\phi))$ and the scaling factor of 932 in FIG. 9,
  the output signal of the quadrature-phase mixer 1003 scaled by 1040 a difference between a product of $\tan(\phi)$ and the scaling factor of 934 in FIG. 9, and one, and
  the output signal of the quadrature-phase mixer 1013 scaled by 1038 a product of $\tan(\phi)$ and the scaling factor of 932 in FIG. 9.

The example correction network 1050 represents a dense implementation where as few summations and scaling operations as possible are required, which is preferable at least in analog designs. In a typical implementation, the respective voltages of the output signals from the mixers 1002, 1003, 1012, 1013 are converted to respective currents in the scaling process which enables efficient summation (and subtraction) of signals.

Figure 11:
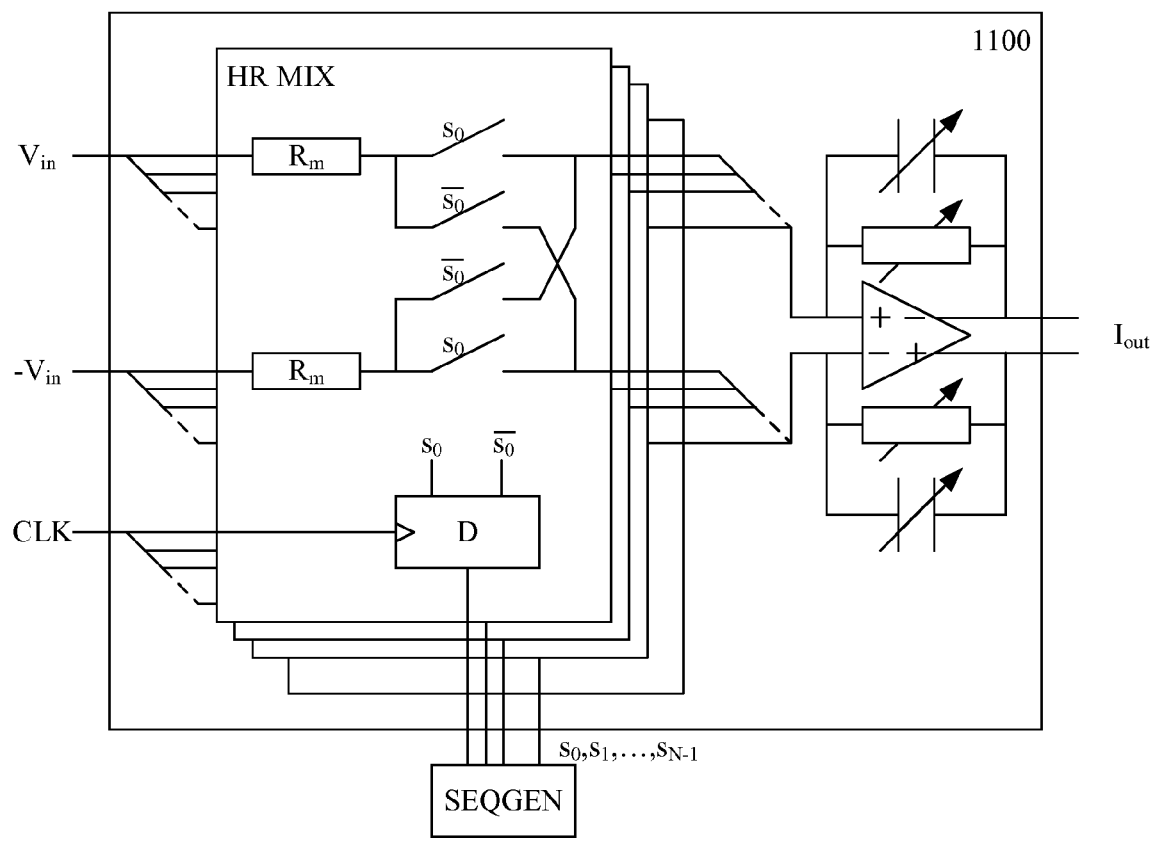
FIG. 11 is schematic diagram illustrating an example implementation of an in-phase or quadrature-phase mixer by resistors and switches.

FIG. 11 illustrates an example implementation of an in-phase or quadrature-phase mixer 1100 by resistors and switches that may, for example, be used to implement any of the mixers 408, 410, 608, 610, 708, 710, 802, 803, 812, 813, 902, 903, 912, 913, 1002, 1003, 1012, 1013 of FIGS. 4, 6-10. Further details of the implementation and operation of the mixer 1100 may be found in L. Sundström, et al., "Complex IF harmonic rejection mixer for non-contiguous dual carrier reception in 65 nm CMOS," IEEE European Solid-State Circuits Conference, September 2012.

Embodiments may appear within an electronic apparatus (such as a wireless communication device) comprising circuitry/logic according to any of the embodiments. The electronic apparatus may, for example, be a wireless communication receiver, a wireless communication transmitter, a wireless communication modem, a portable or handheld mobile radio communication equipment, a mobile radio terminal, a mobile telephone, a base station, a communicator, an electronic organizer, a smartphone, a computer, a notebook, or a mobile gaming device.

Reference has been made herein to various embodiments. However, a person skilled in the art would recognize numerous variations to the described embodiments that would still fall within the scope of the claims. For example, the partition of functional blocks into particular units described in the example embodiments is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

For example, the sequence generator may be implemented as an integral part of each mixer in a respective mixer circuit. Each mixer circuit may be configured to generate a mixer output signal from a mixer input signal by repeatedly clocking through a corresponding sequence of sample values. For the in-phase mixer circuits, the sequence of sample values typically represent one period of the translation frequency sinusoidal function and has a sequence length corresponding to the over-sampling rate. For the quadrature-phase mixer circuits, the sequence of sample values typically represent one period of the translation frequency sinusoidal function phase-shifted by $\pi/2$ plus the phase deviation and has a sequence length corresponding to the over-sampling rate.

Hence, it should be understood that the details of the described embodiments are merely for illustrative purpose and by no means limiting. Instead, all variations that fall within the range of the claims are intended to be embraced therein.

The invention claimed is:

1. A quadrature mixer arrangement adapted to frequency translate a mixer arrangement input signal by a translation frequency to produce a mixer arrangement output signal, wherein the quadrature mixer arrangement is adapted to be operated at a mixer arrangement clock rate that equals the translation frequency times an oversampling rate, wherein the oversampling rate plus an integer number of one, two or three is a multiple of four, the quadrature mixer arrangement comprising:
    a sequence generator adapted to generate, based on the oversampling rate, an in-phase mixer translation sequence and a quadrature-phase mixer translation sequence, wherein
    the in-phase mixer translation sequence is a time-discrete representation of a translation frequency sinusoidal function sampled at the mixer arrangement clock rate, and
    the quadrature-phase mixer translation sequence is a time-discrete representation of the translation frequency sinusoidal function phase-shifted by 90 degrees plus a phase deviation and sampled at the mixer arrangement clock rate, the phase deviation being a function of the oversampling rate;
    at least one pair of mixers, each pair comprising an in-phase mixer and a quadrature-phase mixer, wherein
    the in-phase mixer is adapted to, based on the in-phase mixer translation sequence, translate an in-phase mixer input signal to produce an in-phase mixer output signal,
    the quadrature-phase mixer is adapted to, based on the quadrature-phase mixer translation sequence, translate a quadrature-phase mixer input signal to produce a quadrature-phase mixer output signal, and
    the in-phase mixer input signal and the quadrature-phase mixer input signal are associated with the mixer arrangement input signal, and the in-phase mixer output signal and the quadrature-phase mixer output signal are associated with the mixer arrangement output signal; and
    one or more correction networks adapted to, based on the oversampling rate and the phase deviation, compensate for the phase deviation by adjusting at least one of the in-phase mixer input signal, the quadrature-phase mixer input signal, the in-phase mixer output signal, and the quadrature-phase mixer output signal.

2. The mixer arrangement of claim 1 wherein the sequence generator comprises a shifter adapted to generate the quadrature-phase mixer translation sequence as the in-phase mixer translation sequence shifted a number of positions or to generate the in-phase mixer translation sequence as the quadrature-phase mixer translation sequence shifted a number of positions.

3. The mixer arrangement of claim 1 wherein the sequence generator is adapted to generate each of the quadrature-phase mixer translation sequence and the in-phase mixer translation sequence to optimize harmonic rejection properties of the mixer arrangement.

4. The mixer arrangement of claim 1, wherein the phase deviation is less than or equal to an equivalent phase of an inverse of the mixer arrangement clock rate divided by 2.

5. The mixer arrangement of claim 1, wherein the in-phase mixer is adapted to multiply the in-phase mixer input signal with the in-phase mixer translation sequence to produce the in-phase mixer output signal, and wherein the quadrature-phase mixer is adapted to multiply the quadrature-phase mixer input signal with the quadrature-phase mixer translation sequence to produce the quadrature-phase mixer output signal.

6. The mixer arrangement of claim 1, wherein the sequence generator is adapted to generate at least one of the in-phase and quadrature-phase mixer translation sequences by addressing a memory based on the oversampling rate.

7. The mixer arrangement of claim 1 wherein the in-phase and quadrature-phase mixers are implemented by respective variable conductance circuits, each having the respective mixer translation sequences as a control input signal.

8. The arrangement of claim 1, wherein the one or more correction networks are adapted to perform the adjustment by scaling operations and adding operations, wherein the scaling operations are based on the phase deviation.

9. The arrangement of claim 8,
    wherein the one or more correction networks are further adapted to compensate for an amplitude deviation by adjusting at least one of the in-phase mixer input signal, the quadrature-phase mixer input signal, the in-phase mixer output signal, and the quadrature-phase mixer output signal, and
    wherein the scaling operations are further based on the amplitude deviation.

10. The mixer arrangement of claim 1, wherein the one or more correction networks are further adapted to compensate for an amplitude deviation by adjusting at least one of the in-phase mixer input signal, the quadrature-phase mixer input signal, the in-phase mixer output signal, and the quadrature-phase mixer output signal.

11. The mixer arrangement of claim 1, wherein:
    the mixer arrangement is adapted to down-convert the mixer arrangement input signal to produce the mixer arrangement output signal, the mixer arrangement output signal having an in-phase component and a quadrature-phase component, the mixer arrangement input signal is used as the in-phase mixer input signal and as the quadrature-phase mixer input signal, and the one or more correction networks is adapted to adjust at least one of the in-phase mixer output signal and the quadrature-phase mixer output signal and output the in-phase component and the quadrature-phase component of the mixer arrangement output signal.

12. The mixer arrangement of claim 1, wherein:

the mixer arrangement input signal has an in-phase component and a quadrature-phase component and comprises two carrier aggregation components, the mixer arrangement is adapted to down-convert the mixer arrangement input signal to produce the mixer arrangement output signal, the mixer arrangement output signal having an in-phase component and a quadrature-phase component for each of the carrier aggregation components, the at least one mixer pairs comprise a first mixer pair using the in-phase component of the mixer arrangement input signal as the in-phase mixer input signal and as the quadrature-phase mixer input signal, and a second mixer pair using the quadrature-phase component of the mixer arrangement input signal as the in-phase mixer input signal and as the quadrature-phase mixer input signal, the one or more correction networks are adapted to, for each of the mixer pairs, adjust at least one of the in-phase mixer output signal and the quadrature-phase mixer output signal and output respective in-phase and quadrature-phase correction network output signals, the mixer arrangement further comprising a carrier aggregation separation network adapted to produce the mixer arrangement output signal based on the in-phase and quadrature-phase correction network output signals of the first and second mixer pairs.

13. The mixer arrangement of claim 1, wherein:

the mixer arrangement input signal has an in-phase component and a quadrature-phase component and comprises two carrier aggregation components, the mixer arrangement is adapted to down-convert the mixer arrangement input signal to produce the mixer arrangement output signal, the mixer arrangement output signal having an in-phase component and a quadrature-phase component for each of the carrier aggregation components, the at least one mixer pairs comprise a first mixer pair using the in-phase component of the mixer arrangement input signal as the in-phase mixer input signal and as the quadrature-phase mixer input signal, and a second mixer pair using the quadrature-phase component of the mixer arrangement input signal as the in-phase mixer input signal and as the quadrature-phase mixer input signal, the one or more correction networks is adapted to produce the mixer arrangement output signal based on the in-phase and quadrature-phase mixer output signals of the first and second mixer pairs, wherein producing the mixer arrangement output signal comprises compensating for the phase deviation, compensating for an in-phase/quadrature-phase imbalance present in the mixer arrangement input signal, and providing carrier aggregation separation.

14. The mixer arrangement of claim 1, wherein:

the mixer arrangement is adapted to up-convert the mixer arrangement input signal to produce the mixer arrangement output signal, the mixer arrangement input signal having an in-phase component and a quadrature-phase component, the one or more correction networks is adapted to adjust at least one of the in-phase component and the quadrature-phase component of the mixer arrangement input signal, and output the in-phase mixer input signal and the quadrature-phase mixer input signal, and the mixer arrangement output signal comprises the in-phase mixer output signal and the quadrature-phase mixer output signal.

15. A wireless communication receiver comprising the mixer arrangement of claim 1.

16. A wireless communication transmitter comprising the mixer arrangement of claim 1.

17. A wireless communication modem comprising the mixer arrangement of claim 1.

18. A wireless communication device comprising the mixer arrangement of claim 1.

* * * * *